United States Patent [19]

Waddell et al.

[11] Patent Number: 4,740,442
[45] Date of Patent: Apr. 26, 1988

[54] OPTICAL COATING

[75] Inventors: Ewan M. Waddell, Glasgow; James S. Orr, Falkirk; Brian C. Monachan, Glasgow, all of Scotland

[73] Assignee: Barr & Stroud Limited, Glasgow, Scotland

[21] Appl. No.: 862,078

[22] Filed: May 12, 1986

[30] Foreign Application Priority Data

May 11, 1985 [GB] United Kingdom ............... 8512005

[51] Int. Cl.$^4$ .................. G03G 15/08; B05D 3/06
[52] U.S. Cl. .................... 430/95; 156/613; 156/614; 427/53.1; 427/162
[58] Field of Search ........... 156/613, 614; 427/53.1, 427/162; 204/164; 430/95, 281

[56] References Cited

U.S. PATENT DOCUMENTS

| | | | |
|---|---|---|---|
| 4,394,400 | 7/1983 | Green et al. | 427/38 |
| 4,495,262 | 1/1985 | Matsuzaki et al. | 430/58 |
| 4,592,981 | 6/1986 | Saitoh et al. | 430/57 |
| 4,608,272 | 8/1986 | Rowe et al. | 427/53.1 |

Primary Examiner—Nancy A. B. Swisher
Assistant Examiner—Patrick J. Ryan
Attorney, Agent, or Firm—Pennie and Edmonds

[57] ABSTRACT

Optical components (16), particularly germanium components, are provided with a coating on exposed surface (15) within a vacuum chamber (17) by production of a glow discharge plasma containing carbon and another depositable element from feedstock gases which are fed to the chamber (17) via mass-glow rate controllers (9, 10, 11). The mass flow rate of the feedstock gases is maintained substantially constant at predetermined levels during respective time intervals to provide a multi-layer coating of predetermined characteristics. Typically the coating has at least one first layer which is amorphous hydrogenated germanium carbide, at least one second layer which is amorphous hydrogenated germanium and at least one third layer which is amorphous hydrogenated carbon, these layers being ordered such that each second layer is bounded on each side by a first layer and the third layer is bounded on one side by a first layer, the other side of the third layer forming the exposed surface of the coating.

5 Claims, 2 Drawing Sheets

OPTICAL COATING

This invention relates to a process for coating optical components, to apparatus for coating optical components in a glow discharge plasma and to coatings for optical components.

There are a number of known techniques for coating optical components but hitherto it has not proved practical to provide a coating which is multilayer, very hard, wear-resistant, substantially transparent to infrared radiation and substantially anti-reflective to infrared radiation. Primarily this arises because in a multilayer coating the thickness of each layer is of critical importance and existing methods of measuring thickness have proved expensive, complex and inadequate.

The present invention comprises a process for coating optical components comprising the steps of providing a vacuum chamber containing a cathode, arranging a substrate to be coated on the cathode, providing in the chamber a glow discharge plasma containing carbon and another element to be deposited as a coating, feeding gases containing carbon and said other element to the chamber during growth of the coating, and controlling the mass flow rate of said gases to be substantially constant at predetermined levels during respective predetermined time intervals, whereby the substrate is provided with a multilayer coating having predetermined characteristics.

Preferably the mass flow rate is maintained constant to within ±10% at each predetermined level.

Preferably the vacuum pressure within the chamber during growth of the coating is controlled to be substantially constant at predetermined levels during said respective predetermined time intervals. Conveniently the vacuum pressure is maintained constant to within ±25% at each predetermined level.

Preferably the electrical bias voltage applied to the cathode during growth of the coating is controlled to be substantially constant at predetermined levels during said respective predetermined time intervals. Conveniently the bias voltage is maintained constant to within ±15% at each predetermined level.

Preferably the temperature of the surface of the optical component being coated is controlled to be substantially constant at predetermined levels during said respective predetermined time intervals. Conveniently the temperature is maintained constant to within ±20° C. at each predetermined level.

By virtue of the present invention where mass flow rate is controlled it has proved possible to dispense with layer thickness measuring devices whilst achieving accurate layer thicknesses.

The gases, the mass flow rates of which are controlled, may for example be Germane (so that the said other element is Ge) and a hydrocarbon gas such as butane. Silane may be used in place of Germane in suitable cases. The optical component may be made of Germanium or Silicon, for example.

The present invention further comprises apparatus for coating optical components, comprising a vacuum chamber containing a cathode, means for delivering a flow of feedstock gases to the chamber, a mass flow rate control arrangement for said means, and means for establishing a glow discharge plasma in said chamber.

The present invention further provides a coating for an optical component, said coating comprising a multiplicity of layers including at least one first layer which is amorphous hydrogenated germanium carbide, at least one second layer which is amorphous hydrogenated germanium, and one third layer which is amorphous hydrogenated carbon, the layers of said multiplicity being arranged such that each second layer is bounded on both sides by a first layer, and the third layer is bounded on one side by a first layer, its other side forming the exposed surface of the coating.

Preferably each first layer has a refractive index of about 2.8, each second layer has a refractive index of about 4.1, and the third layer has a refractive index of about 2.0, the refractive indices being at said predetermined wavelength.

In a first example there is only one second layer, two first layers and the aforesaid third layer. In a second example there are two second layers, three first layers and the aforesaid third layer.

The present invention further comprises an optical component made of germanium and having the aforesaid coating adherent to at least one optical surface of the germanium component.

Preferably the layers of the coating are formed by plasma enhanced chemical vapour deposition (i.e. a glow discharge plasma) from germane ($GeH_4$) and Hydrocarbon (such as Butane ($C_4H_{10}$)) feed gases.

Preferably the temperature of the surface of the optical component being coated is maintained at a first predetermined level during deposition of each of the first and second layers and at a second predetermined level during deposition of the third layer, the second predetermined level being substantially less than the first predetermined level. Conveniently the first predetermined level is 350° C. and the second predetermined level is 200° C.

Preferably an electrical bias voltage is applied to the optical component during deposition and the bias voltage is maintained at a first predetermined level during deposition of each of the first and second layers and at a second predetermined level during deposition of the third layer, the second predetermined level being substantially greater than the first predetermined level. Conveniently the first predetermined level is 500 volts and the second predetermined level is 1000 volts.

Preferably the chamber vacuum pressure during deposition of the first and second layers is maintained at a first predetermined level and is maintained at a second predetermined level for the third layer the second predetermined level being substantially less (further from atmospheric) than the first predetermined level. Conveniently the first predetermined level is 50 m Torr and the second predetermined level is 8 m Torr.

Embodiments of the present invention will now be described by way of example with reference to the accompanying drawings, in which.

Figure 1:
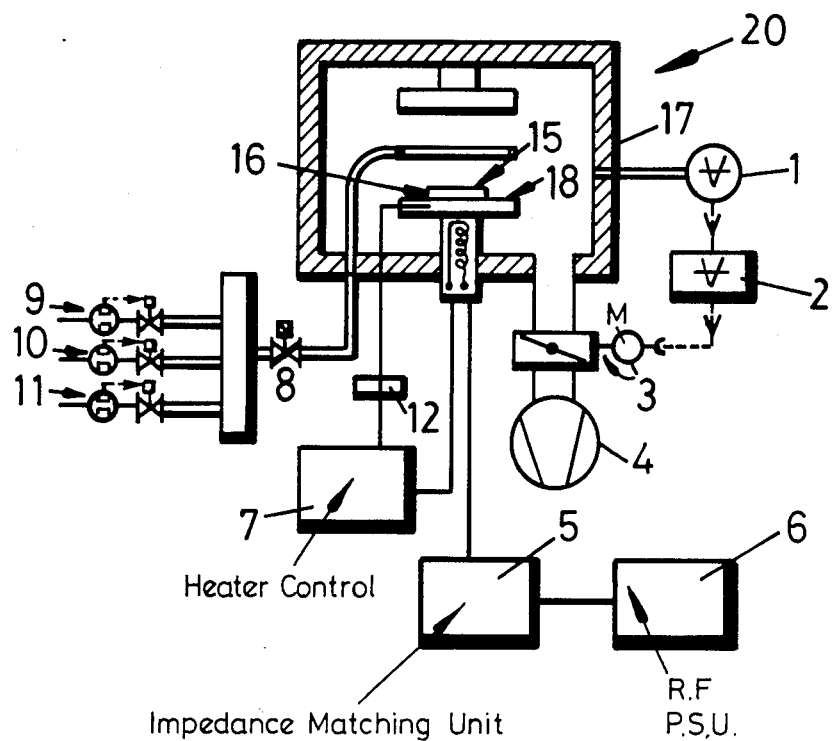
FIG. 1 illustrates apparatus for coating optical components in accordance with the present invention.

As is shown in FIG. 1 of the drawings apparatus 20 for coating optical components comprises a vacuum chamber 17 having a cathode 18 for supporting an optical component 16 to be coated on its exposed surface 15. The cathode 18 is heated by a unit 17 and controlled in temperature by a controller 12 so that surface 15 is maintained at a desired temperature. Additionally AC power at radio frequencies (RF) is supplied to the cathode 18 by a power supply unit 6 via an impedance matching unit 5 (for maximum efficiency). The required level of vacuum is established within the chamber 17 by a high vacuum pump 4, motorised throttle valve 3, capacitance manometer 1 and vacuum controller 2 connected in closed loop. Gases are delivered into the chamber 17 by three pipelines with respective closed-loop mass flow controllers 9, 10, 11 via a common ON-/OFF valve 8.

In one example of a coating deposited on a substrate surface 15 the coating has four discrete layers and the parameters applicable to the apparatus 20 are set forth in Table I. Layers Nos. 1 and 3 are composed of amorphous hydrogenated germanium carbide: Layer No. 2 is composed of amorphous hydrogenated germanium; and Layer No. 4 is composed of amorphous hydrogenated carbon. Prior to the coating being deposited the surface 15 of the substrate 16 is cleaned by sputtering with Argon applied via mass flow controller 9. Layers Nos. 1 and 3 are deposited by feeding butane ($C_4H_{10}$) via mass flow controller 10 and Germane ($GeH_4$) via mass flow controller 11. Layer No. 4 is deposited by feeding only butane ($C_4H_{10}$) via mass flow controller 10. The respective levels of flow rate, vacuum pressure, cathode bias voltage, time interval and temperature of surface 15 are identified in Table I together with the design optical thickness of each layer and the design refractive index each at the predetermined wavelength of 10 μm.

Figure 2:
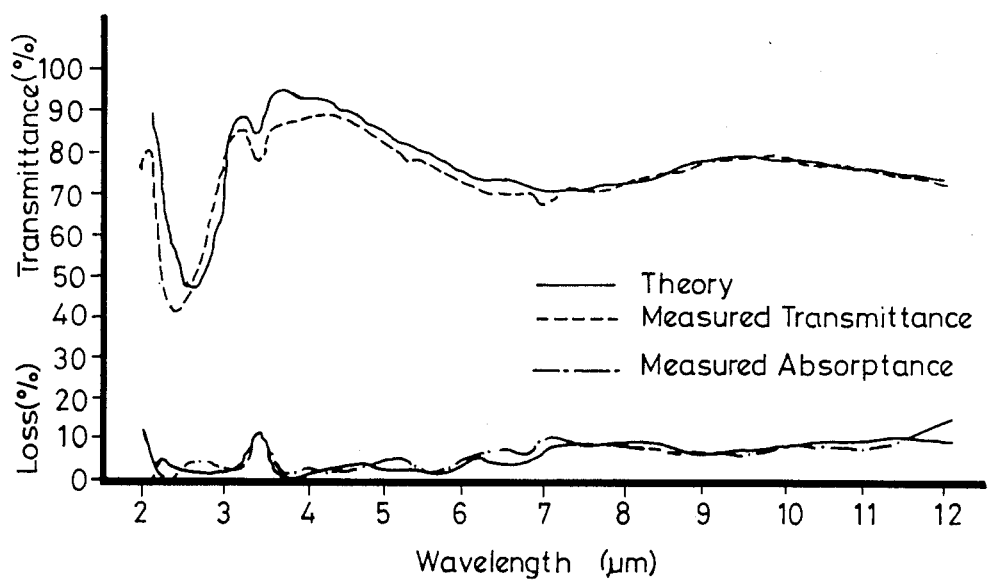
FIG. 2 illustrates the transmittance and absorptance characteristics of a thin germanium substrate coated on both faces with a coating in accordance with the present invention.

In operation of the apparatus 20 the mass flow rates are controlled to within ±10%, the bias voltage is controlled to with ±15%, the vacuum pressure is controlled to within ±25% and the temperature is controlled to within ±20° C. as a result of which it has been found that the characteristics achieved by the resultant coating is within 1% of its design values over the three portions of the infrared waveband of particular interest, namely 2.05 to 2.2 μm, 3 to 5 μm, and 8 to 11.5 μm. The characteristics of the coated substrate are shown in FIG. 2 together with the design characteristics (both faces of the germanium disc having the same coating).

The coating referred to in Table I is designed to have good durability when exposed to environmental conditions, i.e. to be an 'external coating' and when tested against the U.K. standard (TS 1888) provided the results tabulated in Table II. Further tests at more severe levels than TS 1888 produced the results shown in Table III. Exceptional durability is thereby demonstrated.

Figure 3:
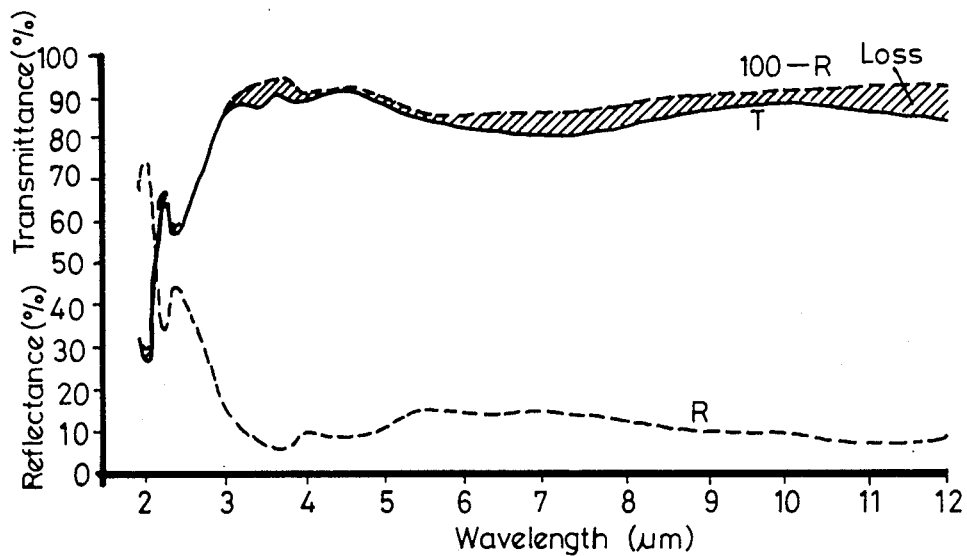
FIG. 3 illustrates the transmittance and reflectance characteristics of a thin germanium substrate coated on one face with a coating in accordance with the present invention and on its other face with a known 'internal surface' coating.
Figure 4:
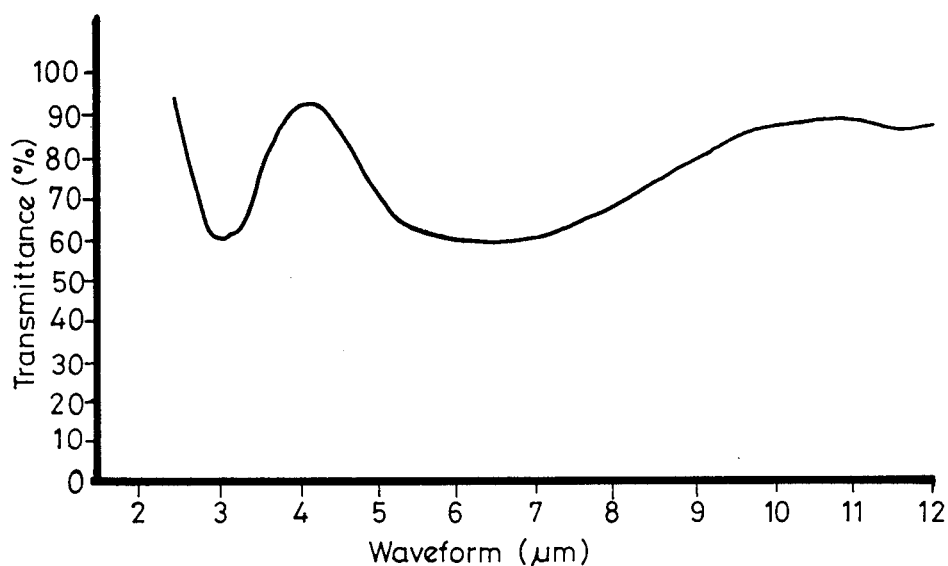
FIG. 4 illustrates the transmittance characteristic of a thin germanium substrate coated on one face with a prior art coating and on its other face with the same known 'internal surface' coating as in FIG. 3.

In practice the coating referred to in Table I would be applied only to one surface of an optical component (which might form a window having therefore only one surface exposed to environmental conditions), the other surface of the component being coated with a known 'internal coating' of which various are known. FIG. 3 illustrates the optical characteristics of such an optical component in the form of a thin germanium disc and for the purposes of comparison FIG. 4 illustrates a characteristic of a similar disc coated with the same 'internal coating' and a prior art 'external coating'. It will be observed that the coating of the present invention (i.e. as per Table I) provides vastly superior characteristics.

The coating referred to in Table I is a four layer coating and, if expanded to a six layer coating as set forth in Table IV exhibits still further improved optical properties notably a 3% reduction in reflectance over the 8 to 11.5 μm waveband. It will be noted that Table IV is relatively concise in the interests of simplicity, but layer Nos. 1, 3 and 5 are each identical in all respects to layers Nos. 1 and 3 of Table I, whilst layers Nos. 2 and 4 are each identical in all respects to layer No. 2 of Table I, and layer No. 6 is identical in all respects to layer No. 4 of Table I.

TABLE I

| LAYER | MATERIAL | GAS | FLOW RATE (STANDARD cm³/ MINUTE i.e. SCCM) | PRES- SURE (m Torr) | BIAS VOLT- AGE (V) | SUB- STRATE TEMPER- ATURE (°C.) | TIME INTERVAL (minutes) | OPTICAL THICKNESS (λ/4 at 10 μm) | REFRAC- TIVE INDEX (at 10 μm) |
|---|---|---|---|---|---|---|---|---|---|
| Substrate Sputter Clean | Germanium | Ar | 5 | 20 | 500 | 350 | 15 | — | 4 |
| 1 | H:α-Ge:C | $C_4H_{10}$ $GeH_4$ | 5 10 | 50 | 500 | 350 | 6.1 | 0.116 | 2.8 |
| 2 | H:α-Ge | $GeH_4$ | 15 | 50 | 500 | 350 | 3 | 0.137 | 4.1 |
| 3 | H:α-Ge:C | $C_4H_{10}$ $GeH_4$ | 5 10 | 50 | 500 | 350 | 32 | 0.689 | 2.8 |
| 4 | H:α-C | $C_4H_{10}$ | 5 | 8 | 1000 | 200 | 22 | 0.416 | 2 |

TABLE II

| TS1888 TEST | NUMBER OF FACES TESTED | NUMBER PASSED |
|---|---|---|
| Adhesion | 4 | 4 |
| Humidity | 4 | 4 |
| Salt Water Immersion (7 days) | 3 | 3 |
| Eraser | 3 | 3 |
| Wiper (10,000 wipes) | 3 | 3 |
| Constant Low Temperatures | 3 | 3 |
| Icing/Frosting | 3 | 3 |
| Driving Rain | 3 | 3 |
| HCI Immersion Test | 1 | 1 |

TABLE III

| OTHER TEST | NUMBER OF FACES TESTED | NUMBER PASSED |
|---|---|---|
| Salt Water Immersion (94 days) | 1 | 1 |
| Wiper (100,000 wipes) | 3 | 3 |
| Wiper (200,000 wipes) | 3 | 2 |
| Thermal Shock (40° C. to 0° C.) | 4 | 4 |
| Extreme Thermal Shock | 2 | 2 |

TABLE III-continued

| OTHER TEST | NUMBER OF FACES TESTED | NUMBER PASSED |
| --- | --- | --- |
| (100° C. to −196° C.) | | |

TABLE IV

| LAYER | MATERIAL | OPTICAL THICKNESS λ/4 AT 10 μm | REFRACTIVE INDEX (AT 10 μm) |
| --- | --- | --- | --- |
| Substrate | Germanium | — | 4 |
| 1 | H:a-Ge:C | 0.0424 | 2.8 |
| 2 | H:a-Ge | 0.699 | 4.1 |
| 3 | H:a-Ge:C | 0.072 | 2.8 |
| 4 | H:a-Ge | 0.188 | 4.1 |
| 5 | H:a-Ge:C | 0.654 | 2.8 |
| 6 | H:a-C | 0.468 | 2 |

What is claimed is:

1. A process for coating infrared transmissive optical components with a multilayer coating which is wear resistant, substantially transparent to infrared radiation, and substantially anti-reflective to infrared radiation, wherein the thickness of each coating layer is measured in fractions of a quarter wavelength at 10 μm, said process including locating a component to be coated on a cathode within a vacuum chamber, establishing vacuum pressure within the chamber, elevating the temperature of the component, applying a desired bias voltage to the cathode, and forming in the chamber a glow discharge plasma with gaseous deposition material fed into the chamber, whereby constituents of the plasma material are caused to be deposited on the component, said process further comprising the steps of sequentially feeding different gaseous deposition materials into the chamber continuously during respective sequential time intervals to form successive different layers of deposition on the component and for each such layer regulating the mass flow rate of the gaseous deposition materials to within ±10% of a predetermined flow rate level; the vacuum pressure of the chamber to within ±25% of a predetermined vacuum pressure level; the cathode bias voltage to within ±15% of a predetermined bias voltage level; and the component temperature to within ±20° C. of a predetermined temperature level, the final layer being amorphous hydrogenated carbon deposited from gaseous deposition material in the form of a hydrocarbon gas, and the duration of each said time interval being of the order of minutes whereby to provide that each layer has a thickness of the order of fractions of a quarter wavelength at 10 μm.

2. A process as claimed in claim 1, wherein the first such layer deposited onto the substrate is amorphous hydrogenated germanium carbide deposited from a mixture of germane and hydrocarbon gas fed as deposition materials, the second such layer deposited onto the substrate is amorphous hydrogenated germanium deposited from germane gas fed as deposition material, and the third such layer deposited onto the substrate is amorphous hydrogenated germane carbide deposited from a mixture of germane and hydrocarbon gas fed as deposition materials, wherein the predetermined levels of vacuum pressure, bias voltage and component temperature remain unchanged during the respective first, second and third time intervals during which said first, second and third layers are deposited to thickness values determined by the respective time intervals and predetermined levels of flow rate, and said final layer is deposited on said third layer.

3. A process as claimed in claim 1, wherein the first such layer deposited onto the substrate is amorphous hydrogenated germanium carbide deposited from a mixture of germane and hydrocarbon gas fed as deposition materials, the second such layer deposited onto the substrate is amorphous hydrogenated germanium deposited from germane gas fed as deposition material, the third such layer deposited onto the substrate is amorphous hydrogenated germane carbide deposited from a mixture of germane and hydrocarbon gas fed as deposition materials, and between said third layer and said final layer there is interposed at least one further layer of amorphous hydrogenated germanium carbide deposited from a mixture of germane and hydrocarbon gas fed as deposition materials and at least one further layer of amorphous hydrogenated germanium deposited from germane gas fed as deposition material, the predetermined levels of vacuum pressure, bias voltage and component temperature remaining unchanged during the respective time intervals during which said first, second, third and each further layers are deposited and differing from the predetermined levels of vacuum pressure, bias voltage and component temperature established during deposition of said final layer.

4. A process as claimed in claim 1, wherein the predetermined level of vacuum pressure during deposition of said final layer is less than that applied during deposition of all preceding layers, the predetermined level of bias voltage during deposition of said final layer is greater than that applied during deposition of all preceding layers, and the predetermined level of component temperature during deposition of said final layer is less than that applied during deposition of all preceding layers.

5. A process as claimed in claim 1, wherein the respective predetermined levels during the respective time intervals are as set forth in Table 1.

* * * * *